(12) United States Patent
Porter et al.

(10) Patent No.: US 6,864,466 B2
(45) Date of Patent: Mar. 8, 2005

(54) SYSTEM AND METHOD TO CONTROL RADIAL DELTA TEMPERATURE

(75) Inventors: Cole Porter, Tracy, CA (US); Alan L. Starner, Orange, CA (US)

(73) Assignee: Aviza Technology, Inc., Scotts Valley, CA (US)

(*) Notice: Subject to any disclaimer, the term of this patent is extended or adjusted under 35 U.S.C. 154(b) by 0 days.

(21) Appl. No.: 10/095,974

(22) Filed: Mar. 8, 2002

(65) Prior Publication Data

US 2003/0168442 A1 Sep. 11, 2003

Related U.S. Application Data

(60) Provisional application No. 60/274,532, filed on Mar. 3, 2001.

(51) Int. Cl.[7] .................................................. H05B 1/02
(52) U.S. Cl. ...................................... 219/494; 219/390
(58) Field of Search ................................ 219/494, 497, 219/490, 390, 485, 250, 251, 501; 200/299, 121; 60/285

(56) References Cited

U.S. PATENT DOCUMENTS

| 5,436,172 A | 7/1995 | Moslehi |
| 5,618,351 A | 4/1997 | Koble, Jr. et al. |
| 5,635,409 A | 6/1997 | Moslehi |
| 5,994,675 A | 11/1999 | Bethune et al. |
| 6,005,225 A | 12/1999 | Kowalski et al. |
| 6,059,567 A | 5/2000 | Bolton et al. |
| 6,133,550 A | 10/2000 | Griffiths et al. |
| 6,207,937 B1 | 3/2001 | Stoddard et al. |
| 6,222,164 B1 | 4/2001 | Stoddard et al. |
| 6,273,604 B1 | 8/2001 | Hemmerich et al. |
| 6,286,305 B1 * | 9/2001 | Poublon et al. ............... 60/285 |
| 6,294,394 B1 | 9/2001 | Erickson et al. |
| 6,348,099 B1 | 2/2002 | Xia et al. |
| 6,350,964 B1 | 2/2002 | Boas et al. |
| 6,355,909 B1 | 3/2002 | Griffiths et al. |
| 6,423,949 B1 | 7/2002 | Chen et al. |

* cited by examiner

Primary Examiner—Quang T. Van
(74) Attorney, Agent, or Firm—Dorsey & Whitney LLP

(57) ABSTRACT

A system and method of minimizing stress related to the ramp rate of a variable by limiting the ramp rate as a function of the current value of the variable is provided. More specifically, the present invention provides a system and method of maintaining the radial delta temperature of a semiconductor substrate or other heated body below the crystal slip curve by dynamically controlling the temperature ramp rate during processing.

8 Claims, 8 Drawing Sheets

SYSTEM AND METHOD TO CONTROL RADIAL DELTA TEMPERATURE

CROSS REFERENCE TO RELATED APPLICATIONS

This application claims priority to U.S. Provisional Application Ser. No. 60/274,532, filed Mar. 8, 2001, and to copending U.S. patent application Ser. No. 10/068,127 which was filed on Feb. 6, 2002 the disclosures of both of which are hereby incorporated by reference in their entirety.

FIELD OF THE INVENTION

The present invention relates generally to a system and method of minimizing the stress related to the ramp rate of a control variable during a manufacturing process such as, for instance, the temperature of a semiconductor substrate or wafer during processing of the substrate. More specifically, the present invention provides an enhanced system and method of maintaining the radial delta temperature (RDT) of a wafer during processing below an excess thermal stress curve by controlling the temperature ramp rate during processing. In the semiconductor industry, it is desirable to obtain temperature uniformity in the substrate during temperature cycling of the substrate. Temperature uniformity provides uniform process outputs on the substrate, such as layer thickness, resistivity, and junction depth, for temperature activated steps including film deposition, oxide growth and diffusion of dopants. In addition, temperature uniformity in the substrate is necessary to prevent thermal stress-induced wafer damage such as warpage, defect generation and crystal structure "slip."

BACKGROUND OF THE INVENTION

Manufacturing and other processing systems typically involve changing the value of one or more control variables, including but not limited to temperature, pressure, gas flow rates, concentration, tension, voltage, applied force, and position. The rate at which a control variable is changed from a starting value to an ending value is the ramp rate or first derivative of that variable, known generically as the ramp rate. For instance, the ramp rate or first derivative of position with regards to time (such as dx/dt) is velocity. It is often desirable to minimize stresses to which equipment and/or products are exposed during a process. Excess stress can lead to reduced efficiency of a process or to premature failure of equipment or products. In many systems, stresses are a function of the ramp rate of one or more control variables. The ramp rate may be reduced to maintain stress below an acceptable threshold. However, unnecessarily severe ramp rate limits are also undesirable because they slow process throughput. An illustrative example of this concept is drawn from semiconductor processing systems. It should be noted, however, that ramp-rate related problems are not unique to the application discussed in detail herein. Rather, the examples are meant to be merely illustrative and not limiting in any way.

An important aspect in the manufacture of semiconductors and integrated circuits is the temperature variations and values that semiconductor wafers are subjected to during processing. Two important limitations apply to heating and cooling of semiconductor wafers: 1) acceleration and deceleration of the temperature ramp rate cannot occur more rapidly than the thermal inertia of the wafer will permit and 2) the temperature difference between the center and edge of a wafer should be kept sufficiently small to prevent thermal expansion damage to the wafer. Thermal inertia describes the resistance of a mass to instantaneously jumping from a steady-state temperature or zero ramp rate state to a finite non-zero ramp rate and back to steady state again. Real objects are incapable of the instantaneous and infinite "acceleration" and deceleration" in temperature ramp rates that are necessary to heat or cool under these idealized requirements. Temperature acceleration or deceleration is the second time derivative of temperature. Just as for positional acceleration and deceleration of a mass at rest, the temperature acceleration and deceleration rates cannot be infinite.

When heating or cooling from one temperature to another within a furnace, such as a semiconductor wafer processing system, it is often important to reach the desired setpoint temperature in a minimum amount of time. Classically, a furnace will use a controlled linear ramp to go from one temperature setpoint to another. Linear ramping is plagued by two disadvantages: a delay in attainment of the desired temperature ramp rate by the substrate being heated; and a tendency for the temperature of the substrate to overshoot the desired setpoint and then oscillate around the set point temperature before achieving a steady state temperature. A solution to this problem employing physically attainable temperature ramp rate acceleration and deceleration phases is described in copending U.S. patent application Ser. No. 10/068,127, the text of which is incorporated herein by reference.

Of additional importance is limiting the maximum temperature ramp rate to protect against negative thermal effects on the object or objects being heated due to excessive internal temperature gradients within the object. This is of particular concern in semiconductor wafer processing systems in which important manufacturing aspects are the temperature variations and values that the semiconductor wafers are subjected to during processing. In particular, the temperature difference between the center and the edge of the wafer during processing in a rapid thermal processing furnace or other similar equipment is of significant interest since excessive heating or cooling of the edge of a wafer relative to its center can result in physical and/or chemical damage that could render the wafer unuseable or lead to early failure of semiconductor chips manufactured from the wafer. This edge-center temperature difference is referred to as the radial delta temperature, or radial delta-T (RDT). The problem particularly affects batch furnaces, which apply heat to the outside edge of a stack of wafers. During heating with a radiative heat source such as a resistive heating coil or a heat lamp, the wafer edges may, at times, be several degrees (or even tens of degrees) hotter than the center of the wafer because radiative heat transfer is greatest at the wafer edges. Conversely, during cooling, the edges undergo more rapid heat loss through radiative cooling and thus may be substantially cooler than the wafer centers. At high temperatures, this RDT may induce crystal slip on the wafer.

The advantages of limiting temperature ramp rates to minimize thermal expansion stress induced crystal slip damage on semiconductor substrates is well known. It is desirable to minimize the RDT during processing to minimize excess thermal stress occurring on the substrate. The temperature ramp rate during processing is the primary factor in determining the RDT. At higher ramp rates, the thermal inertia of a substrate being heated can further exacerbate the temperature variations between its edge and its center as heat applied to the edges is not instantaneously conducted to the center of the substrate. At lower temperatures, a larger RDT can be tolerated without causing excess thermal stress because silicon atom-to-atom bonds are stronger and can withstand more thermal stress at lower temperatures. Thus, it is desirable to provide a system and method for the control of RDT across a substrate. To avoid exceeding the maximum allowable thermal stress on a wafer, prior art methods rely on manually programmed sequences of fixed ramp rates. This approach prevents the process from functioning at the maximum possible ramp rate throughout a heating or cooling process because the actual maximum allowable ramp rate to avoid RDT-induced thermal stress damage varies with temperature as noted above. Furthermore, this segmented ramp rate profile can also result in ramp rates that exceed the allowable maximum RDT for a given temperature. Heating with a noncontinuous temperature ramp profile therefore deviates from the ideal maximum ramp rate curve.

Accordingly an improved system and method of temperature control is needed to govern the ramp rate as a function of the temperature of a body or substrate being heated or cooled.

SUMMARY OF THE INVENTION

It is an object of the present invention to provide an improved system and method for limiting the radial delta temperature on a substrate as it is heated by controlling the temperature ramp rate during processing. Specifically, the present invention provides a system and method of controlling the radial delta temperature (RDT) across a substrate by using a dynamically variable temperature ramp rate. In general, the temperature ramp rate is reduced as the temperature of the body increases. More particularly, the present invention provides an improved system and method of controlling the radial delta temperature occurring as a substrate is heated in a manufacturing process, such as but not limited to semiconductor wafer processing and equipment.

One embodiment of the present invention provides a method of limiting the rate at which a variable is ramped. A maximum allowable ramp rate of the variable is calculated at the current setpoint value of the variable. The variable is ramped at no greater than this maximum allowable ramp rate until the next setpoint value of the variable under control is reached.

In another embodiment of the present invention, a method is provided for changing the temperature of a body housed in a heating chamber of a temperature controlled furnace from a starting temperature to an ending temperature using a temperature control algorithm. Temperature data from one or more temperature sensing devices in the heating chamber and a temperature set point are provided as inputs to the temperature control algorithm which controls power delivery to one or more controllable heating elements in the furnace. A maximum allowable temperature ramp rate is calculated as a function of the setpoint temperature. The temperature set point is accelerated from the starting temperature at a finite acceleration rate until the calculated maximum allowable temperature ramp rate for the current temperature setpoint is achieved. The temperature set point is decelerated at a finite deceleration rate until the ending temperature is reached such that the temperature of the body reaches the ending set point temperature smoothly without substantially overshooting or oscillating about the ending temperature.

Additional embodiments of the present invention provide a furnace which changes the temperature of a body inside the furnace according to the methods summarized above.

These methods are applicable to a variety of systems requiring precise control of process variables such as temperature set points, gas flow rates, concentrations, pressures, tension, voltage, applied force, and position. In one illustrative embodiment, the system and method of the present invention is carried out in a multi-zone furnace used in semiconductor processing.

BRIEF DESCRIPTION OF THE DRAWINGS

Other objects and advantages of the present invention will become apparent upon reading the detailed description of the invention and the appended claims provided below, and upon reference to the drawings, in which:

DETAILED DESCRIPTION OF THE INVENTION

As described above, it is desirable to minimize the radial delta temperature or RDT across a body such as, for instance, a semiconductor substrate or wafer, to avoid the occurrence of excess thermal stress or crystal "slip" on the body. The method of the present invention is also generically applicable to any process in which the maximum ramp rate of a control variable is limited to minimize stress in a system. According to one embodiment of the present invention, RDT is maintained below the excess thermal stress curve by controlling the temperature ramp rate. This curve of maximum allowable thermal stress is a function of temperature. The present invention provides that the maximum temperature ramp rate varies with temperature to maintain the excess thermal stress curve below the maximum allowable value for the current temperature of the body being heated.

At lower temperatures, a body such as a semiconductor wafer is less susceptible to RDT induced excess thermal stress damage than it is at higher temperatures. Since the ramp rate of temperature in a furnace (such as that shown in FIG. 1) is the primary driving factor determining RDT, the RDT on a body being heated or cooled in a furnace is controlled by limiting the maximum allowable temperature ramp rate as a function of the current temperature in the furnace. At lower temperatures, the ramp rate is permitted to be greater. The ramp rate is gradually reduced as the temperature rises. This gradual reduction in the temperature ramp rate produces a substantially smooth, continuous temperature curve as a function of time. In this manner, the present invention provides for a variable maximum allowable temperature ramp rate. By controlling the ramp rate and RDT in this way, the present invention minimizes the amount of time required to ramp the body or substrate from one temperature to another without causing undue stress or damage to the substrate.

Figure 1:
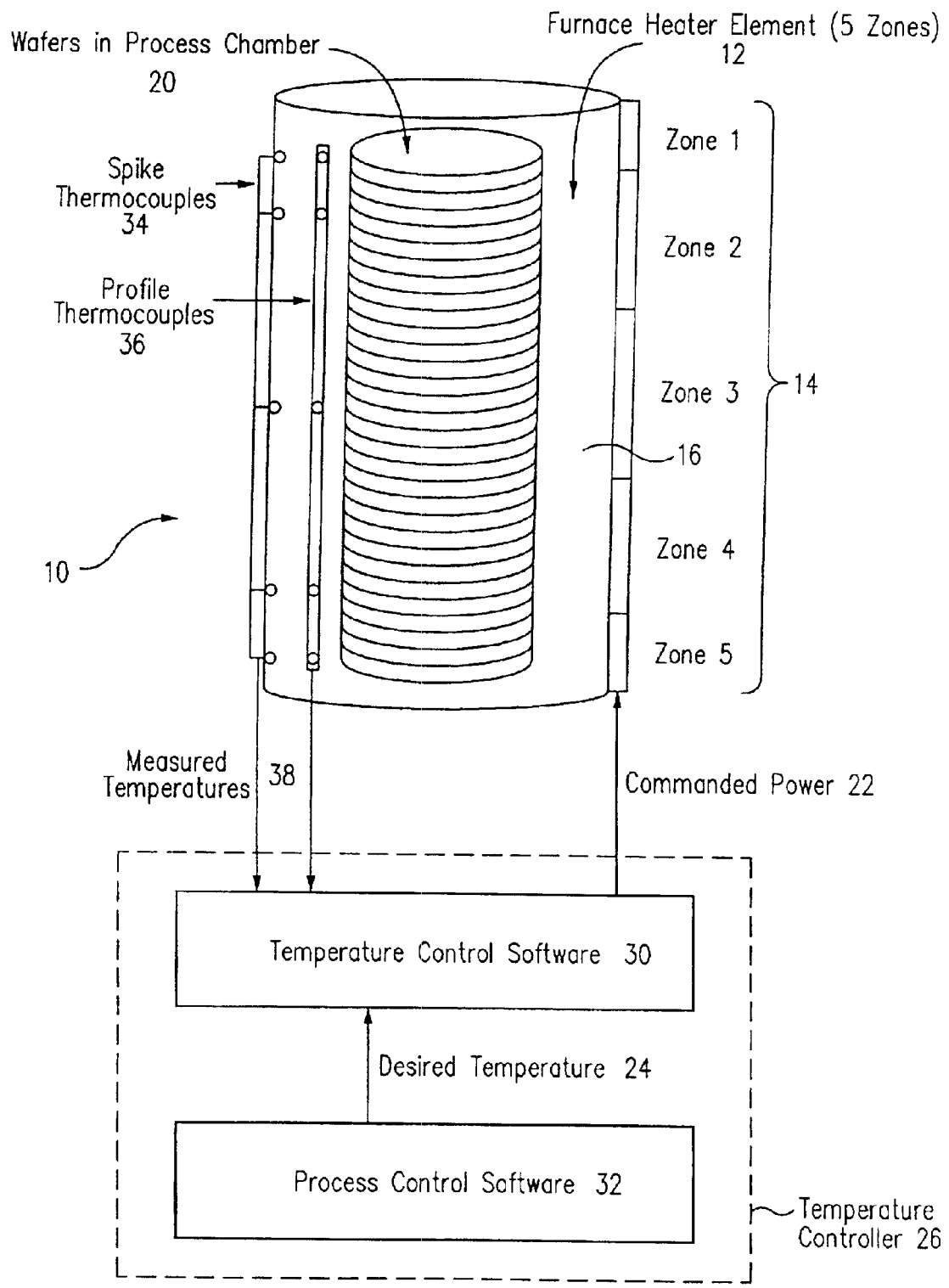
FIG. 1 is a simplified diagram of one example of a furnace used in semiconductor manufacturing which may employ the system and method of the present invention.

In one embodiment of the present invention, a method is provided for limiting the maximum ramp rate at which a control variable—temperature in this example—is increased or decreased. The invention may be carried out on a semiconductor furnace as illustrated in FIG. 1. The furnace 10 in FIG. 1 include a heater element 12 having five separate zones 14, and a heating chamber 16 housing one or more semiconductor substrate wafers 20. A power command or signal 22 is individually controlled in each zone 14. The purpose of the heater element 12 is to heat the wafers 20 to a desired temperature 24. A temperature controller 26 having temperature control software 30 and process control software 32 sends the power command signal 22 to the furnace heater element 12. While a specific semiconductor furnace 10 having five zones 14 is shown, it will be understood by those of skill in the art that the system and method of the present invention can be employed in other types of furnaces, and further can be carried out in other types of semiconductor equipment or other apparatuses designed to controllably change the temperature of a body or object from one setpoint temperature to another. The invention is not limited to the specific examples shown. For example, the invention may be used in a furnace with a different number of zones. Likewise, it may be applied to any other process or system in which stresses may be controlled by limiting the ramp rate of a control variable as a function of that variable. Additionally, the method may be applied to control stress by limiting the ramp rate of one or more variables as a function of those one or more variables.

Figure 2:
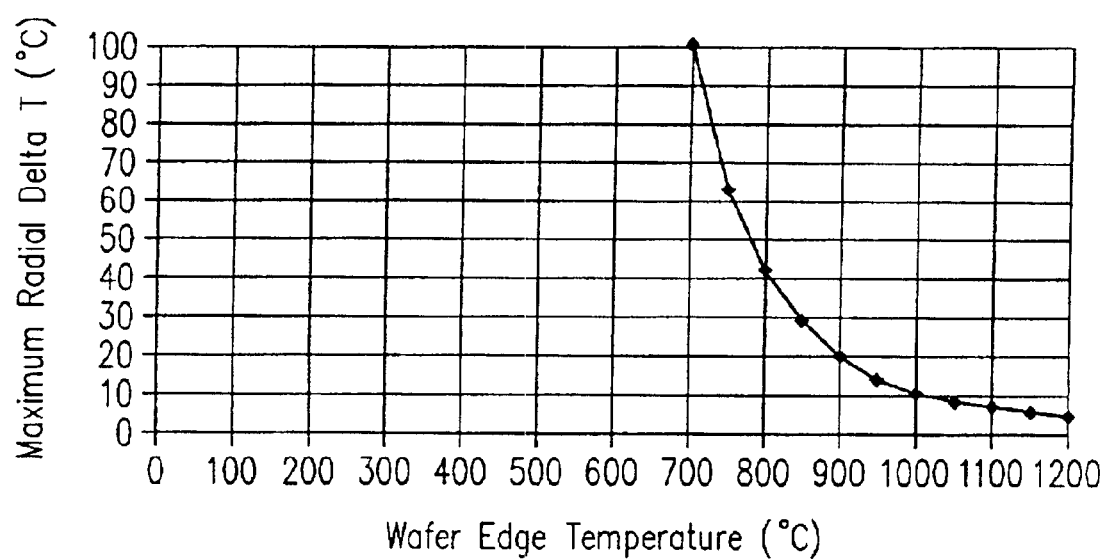
FIG. 2 is a chart of the maximum radial delta temperature vs. the wafer edge temperature for a silicon substrate obtained from Equation 1.

In one embodiment of the present invention, the temperature controller 26 contains temperature control software 30 such as, for instance PID control software configured to maintain control of the furnace 10. The ramping of the set point changes depending on the temperature and final setpoint, and is curved during ramping. More specifically, the ramp rate is the slope of the set point temperature. Since semiconductor substrates tolerate higher RDT without experiencing thermal expansion damage at lower temperatures (typically less than 600° C.) than at elevated temperatures (such as in the range of approximately 600° C. to 1200° C.), the present invention is configured to start ramping the set point more rapidly while the temperatures are relatively low. As the temperature rises, the maximum tolerable RDT decreases, so the ramp rate slows as the temperature increases. The higher the temperature of the substrate or wafer, the slower the ramp rate that is used. The present invention dynamically varies the maximum ramp rate as a function of the current set point temperature. This maximum ramp rate may be derived from a look up table of maximum allowable RDT as a function of temperature or from some other programmed function that provides a maximum ramp rate as a function of temperature. An example of such a lookup table is provided in Table 1. At temperatures between the tabulated values, the maximum allowable RDT is interpolated for a smoothly varying maximum allowable RDT as a function of temperature. An experimentally determined scaling factor is used to convert the maximum allowable RDT to a maximum temperature ramp rate. This scaling factor can be a constant or it can also itself be a function of temperature. For 300 mm wafers, the scaling factor is preferably 0.5° C. per minute per ° C. of RDT. Different ramp rate tables may be used, so software implementing the present invention is preferably configured to allow these ramp rate tables to be selected in the process recipe. Alternatively, the relationship between temperature and maximum ramp rate may be programmed as a series of one or more mathematical functions of temperature. The maximum allowable ramp rate vs. temperature function is predetermined through experimentation which yield the following equation for maximum $\Delta T$ as a function of temperature:

$$\Delta T = \frac{2}{.4928\alpha E} C \frac{f\varepsilon^{\frac{1}{n}}}{ft} e^{\left(\frac{U}{nkT}\right)} \quad (1)$$

where fe/ft is the strain rate, E is Young's modulus ($E=1.9\times 10^{11}$ N m$^{-2}$), a is the coefficient of thermal expansion of the substrate (in this case silicon), C and n are numerical constants ($C=4.5\times 10^4$ N m$^{-2}$ and $n=2.9$), k is Boltzmann's constant ($k=1.38\times 10^{-23}$ J K$^{-1}$), T is the absolute temperature of the edge of the substrate where the thermal gradients are presumed to be the highest, and U is the activation energy for glide movement required for wafer slip. The equation is independent of radius and thus applies to any size substrate. The results of this maximum calculated $\Delta T$ are shown in FIG. 2.

TABLE 1

Maximum ramp rate look up table

| Temperature set point, ° C. | Maximum Allowable RDT, ° C. |
|---|---|
| 600 | 80 |
| 700 | 60 |
| 800 | 44 |
| 900 | 34 |
| 1000 | 26 |
| 1100 | 22 |
| 1200 | 18 |

Figure 3:
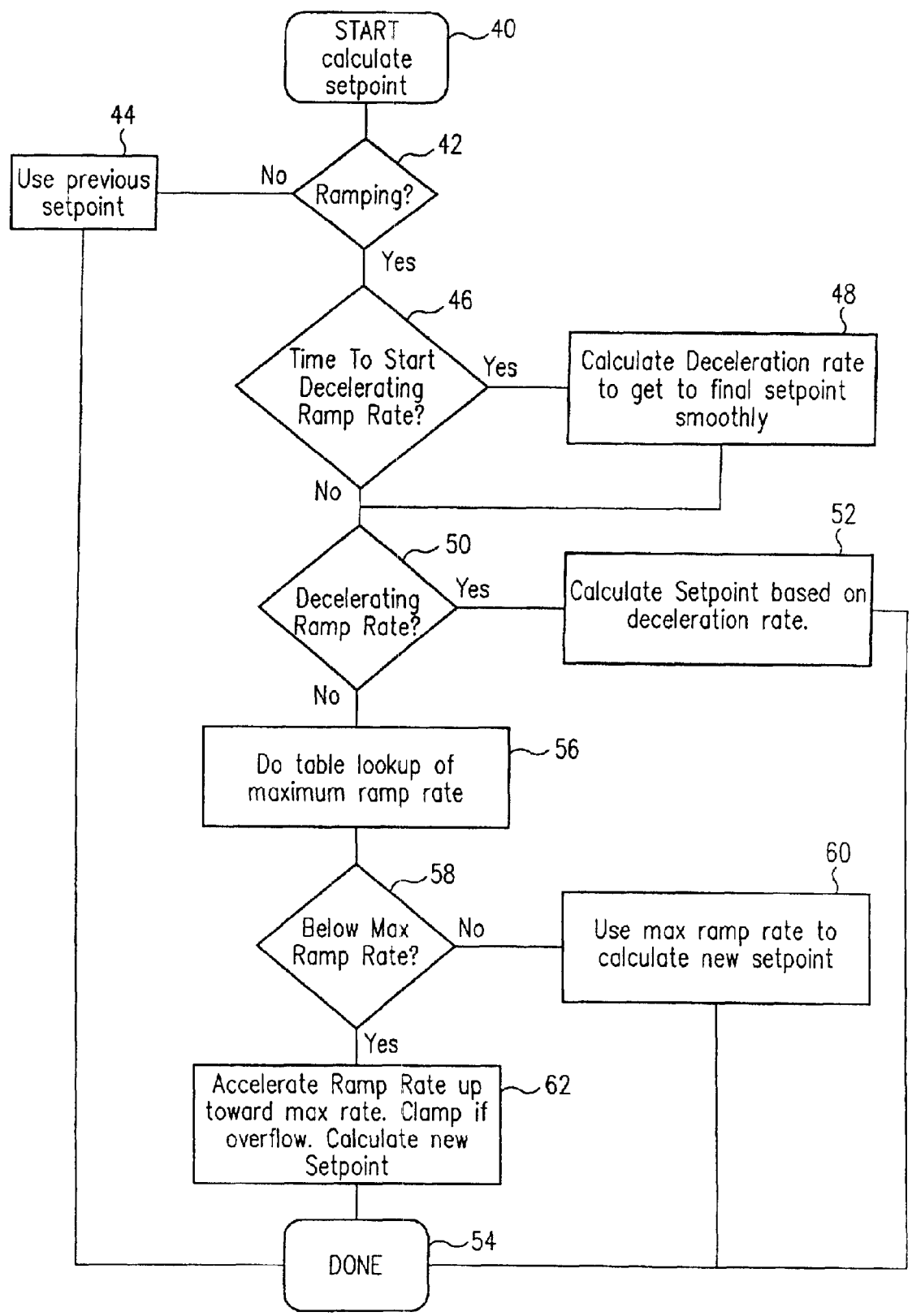
FIG. 3 is a flow chart illustrating one embodiment of the method of the present invention.

More specifically, one embodiment of the method of the present invention is illustrated in FIG. 3. FIG. 3 is a flow chart illustrating one embodiment of the method of the present invention. The method starts at step 40 and a ramping inquiry is made at step 42. If the decision is no, the previous setpoint is used at step 44. If the decision is yes, the inquiry is made whether it is time to start decelerating the ramp rate at step 46. If the decision at step 46 is yes, the method calculates the deceleration rate at step 48. If the decision at step 46 is no, the algorithm verifies whether the ramp rate is currently decelerating. If the ramp rate is decelerating at step 50, then the setpoint is calculated based on the deceleration rate at step 32 and the method is done (step 54). If the ramp rate is found to be not decelerating at step 50, the maximum RDT for the current temperature is determined by a table lookup and interpolation if necessary at step 56. Also at step 56, the maximum RDT value returned from the table lookup is converted to a maximum ramp rate using a scaling factor.

Next, the inquiry is made whether the ramp rate is below the maximum ramp rate at step 58. If no, the maximum ramp rate is used to calculate the new setpoint at step 60. If yes, then the ramp rate is accelerated up toward the maximum ramp rate at step 62.

Figure 4:
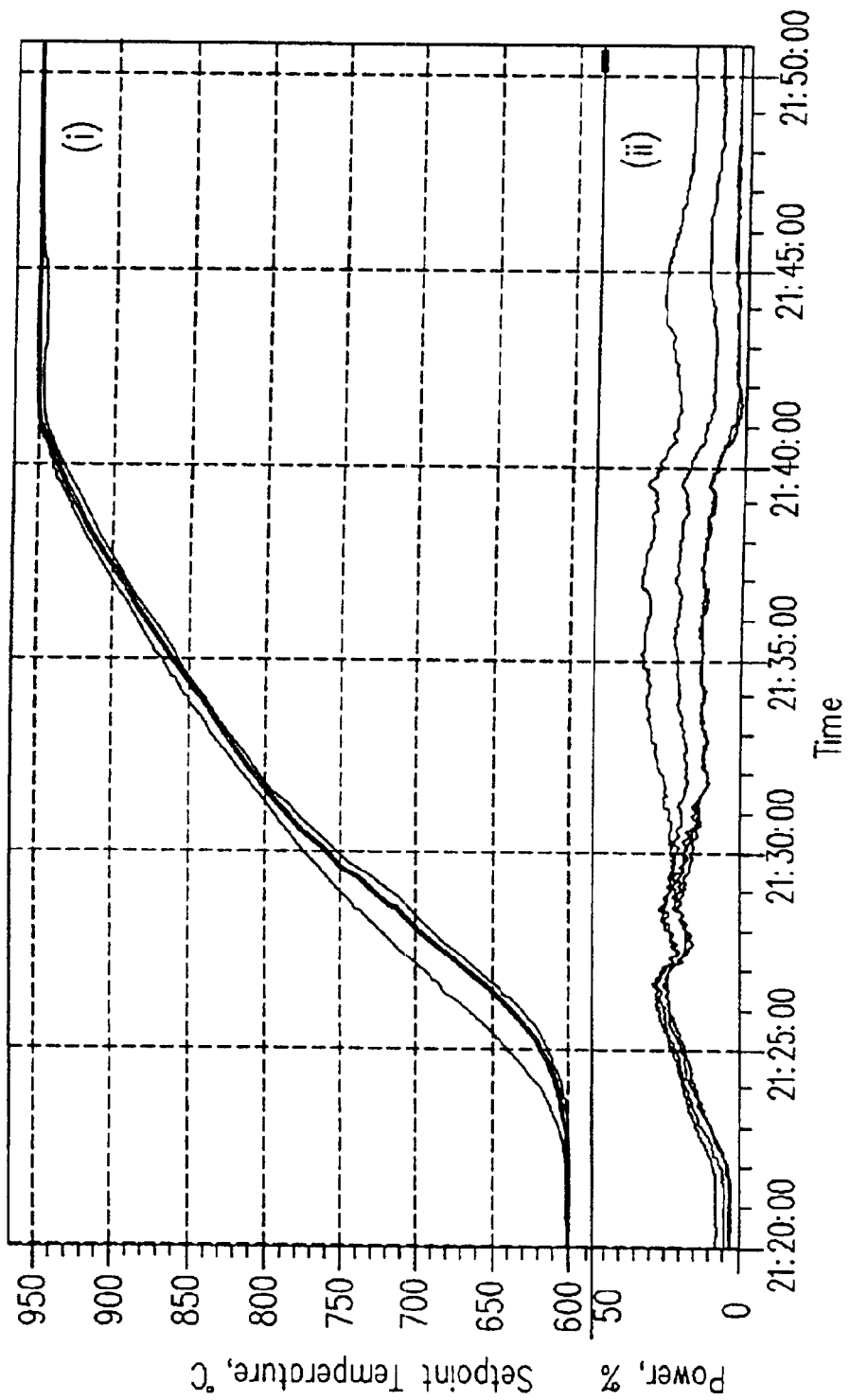
FIG. 4 is a graph showing: (i) the ramped setpoint, and (ii) the wafer temperature weighted average for all zones.

An illustrative implementation of the resulting curved set point is shown graphically in FIG. 4. In practice this embodiment of the present invention may be implemented through the following conceptual steps: a maximum allowable temperature ramp rate is calculated as described above for the current set point temperature and the setpoint temperature is ramped at a rate that does not exceed this maximum allowable ramp rate.

In accordance with a further embodiment of the present invention, the temperature set points are curved while increasing or accelerating the ramp rate from zero at the starting temperature to the maximum ramp rate and then again while decreasing or decelerating the ramp from the maximum ramp rate back to zero at the ending temperature to provide smooth transitions between steady state (zero ramp rate) and ramping phases of the heating or cooling process. The ramp rate is accelerated up to the maximum, and decelerated down to the final set point at a finite and physically attainable rate to minimize oscillations of the actual body temperature relative to the setpoint temperature. In a preferred embodiment of the present invention, the temperature ramp is accelerated and decelerated at a linear acceleration and deceleration rate (the second derivative of the temperature setpoint with regards to time is a constant). However, nonlinear deceleration may be preferred under some conditions.

The setpoint ramp rate fed to the temperature controller follows the lesser of a) the maximum allowable ramp rate temperature curve obtained dynamically from the RDT vs. temperature table and the scaling factor for the current setpoint temperature, b) the ramp rate provided by the setpoint curve, and c) the maximum ramp rate attainable by the furnace until the set point temperature approaches the final setpoint. Then the setpoint ramp rate is decelerated smoothly to meet the final ending temperature. The method of the present invention delivers the wafers to the desired temperature at the fastest possible rate that keeps the RDT below the slip curve.

In this embodiment, preferably two sets of thermocouples: one or more spike thermocouples 34 and one or more profile thermocouples 36, are used for temperature measurement as shown in FIG. 1. The spike thermocouples 34 are closer to the heater element windings (not shown), and respond faster to control inputs. The profile thermocouples 36 are closer to the wafers 20, and thus better represent their temperature. Temperature controller 26 having temperature control software 30 receives the desired temperature 24 set point from process controller 32 having process control software, and reads the measured temperatures 38 of the thermocouples. The measured temperatures 38 are combined mathematically to generate a control temperature (not shown) that provides an estimate of the temperature of the wafers 20. The control temperature is preferably a weighted average of the temperatures measured by the spike thermocouples 34 and the profile thermocouples 36. The weighting may preferentially vary as a function of temperature wit the spike thermocouple 34 temperatures being weighted more strongly at higher temperatures. In a further preferred embodiment, the mathematical combination of the measured temperatures 38 also includes one or more temperature offsets. These offsets can be static or dynamic. In one example, static offsets are employed to correct the control temperature for differences between the temperature of the wafers or other body being heated and the thermocouple temperatures. These offsets may be determined experimentally using thermocouple instrumented wafers. Based on the control algorithm and the inputted control and setpoint temperatures, the temperature controller 26 determines the amount of power to apply to each zone of the furnace heater element 12.

When a ramp rate is specified, the setpoint will ramp at the selected rate. In a preferred embodiment, the setpoint curves smoothly to the final setpoint near the end of the setpoint ramp phase. During the time that the setpoint curves toward the final setpoint, the ramp rate decelerates linearly. This curving of the programmed temperature setpoint is preferentially employed at the end of the ramp. However, it is also advantageously applied to the beginning of the ramp to avoid large oscillations in power demand.

When ramping under the method of the present invention at the maximum temperature ramp rate, the instantaneous temperature setpoint does not jump immediately to the final setpoint as in commonly employed temperature controllers such as PID systems. Instead, the setpoint is accelerated at a finite and physically attainable rate until it reaches either the maximum attainable ramp rate for that zone and setpoint, or the maximum allowable ramp rate for the current temperature obtained from the product of the maximum allowable RDT for the current setpoint temperature from Table 1 and the scaling factor. The maximum allowable temperature ramp rate as a function of the current setpoint temperature is obtained in real time from the product of a Radial Delta-T vs. temperature function and a scaling factor. The RDT vs. temperature function is provided as a mathematical relationship, or in a lookup table as described in the preceding embodiment. If a lookup table is used, the software is configured to interpolate the maximum allowable RDT at temperatures for which a tabulated value is not provided. The scaling factor used to convert maximum allowable RDT at a given temperature to a maximum allowable ramp rate as a function of temperature may be constant or may itself also be a function of temperature.

A system is also provided in an additional embodiment wherein the method of the present invention is used to control the ramp rate of the setpoint temperature in a temperature controlled furnace.

In another embodiment, a system is provided wherein the method of the present invention is combined with the temperature control method described in copending U.S. patent application Ser. No. 10/068,127, the disclosure of which is hereby incorporated by reference in its entirety.

EXPERIMENTAL

Figure 5:
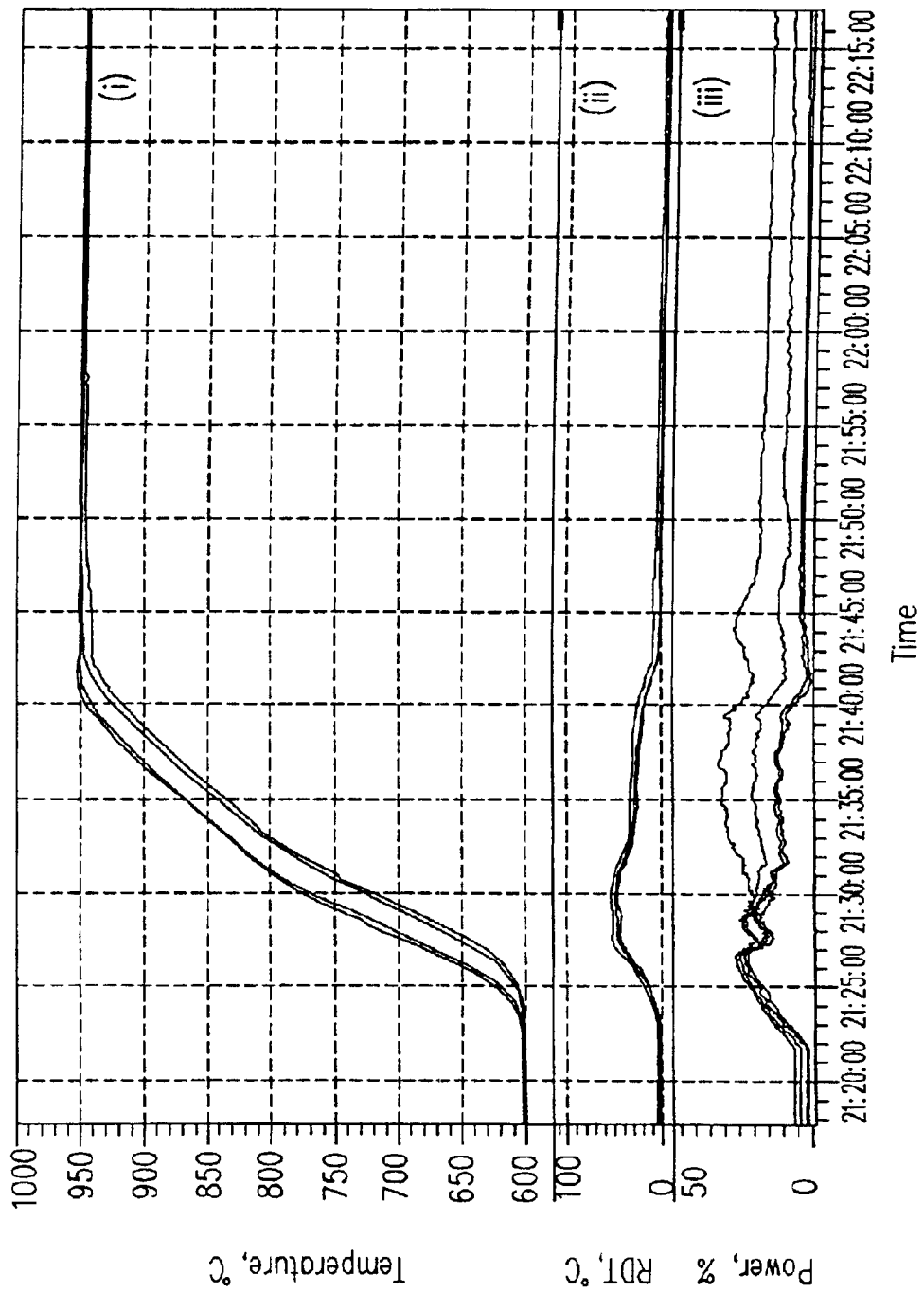
FIG. 5 is a graph showing: (i) the actual center and edge temperatures for all zones; (ii) the RDT value for all zones; and (iii) the furnace power for each zone over time according to one embodiment of the present invention.
Figure 6:
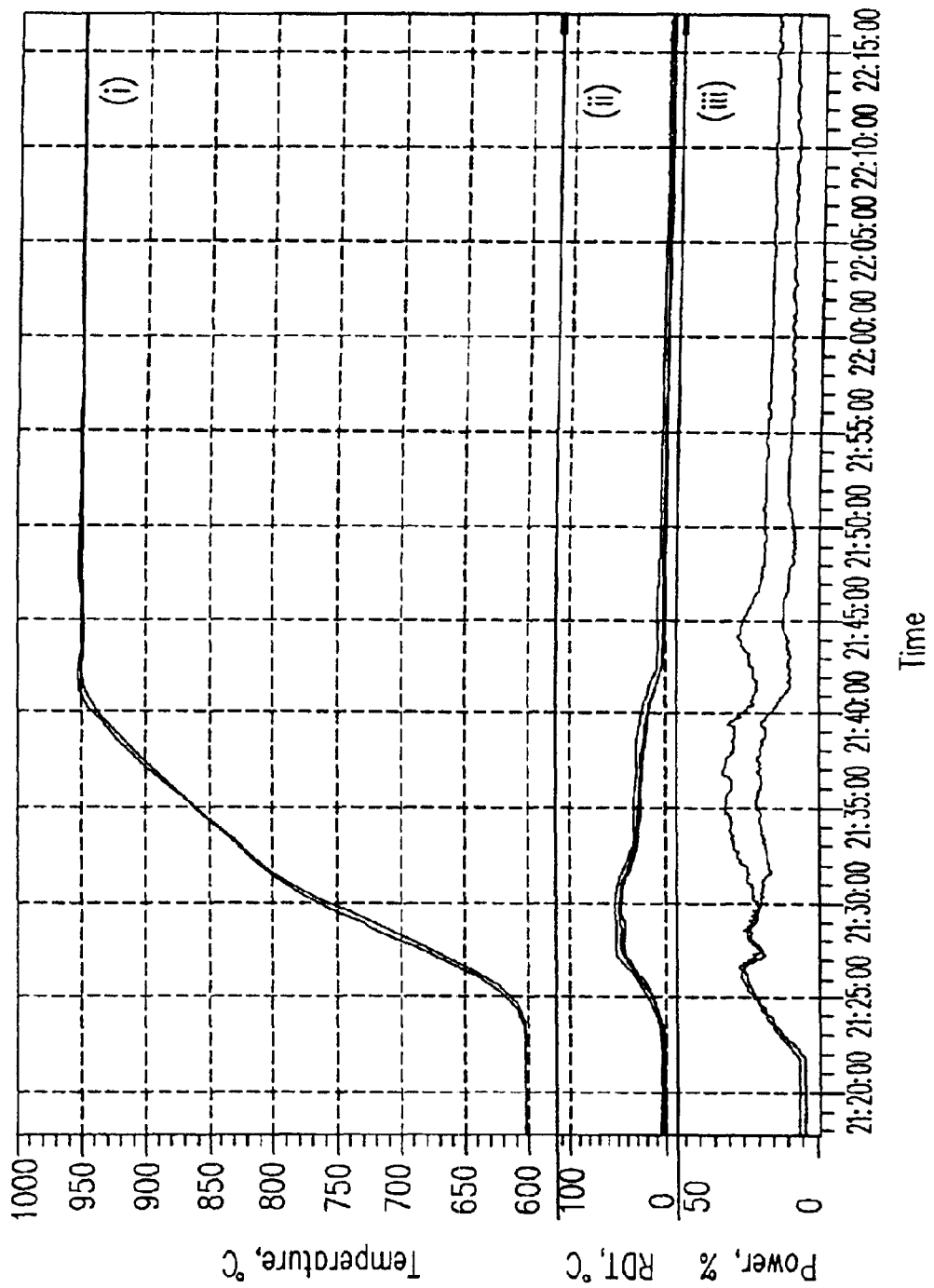
FIG. 6 is a graph illustrating: (i) the weighted average of the center and edge temperature ($\frac{2}{3}$ edge+$\frac{1}{3}$ center) on a semiconductor substrate wafer, which is normally used to represent the overall wafer temperature; (ii) the RDT value for all zones; and (iii) the furnace power for each zone over time according to one embodiment of the present invention.
Figure 7:
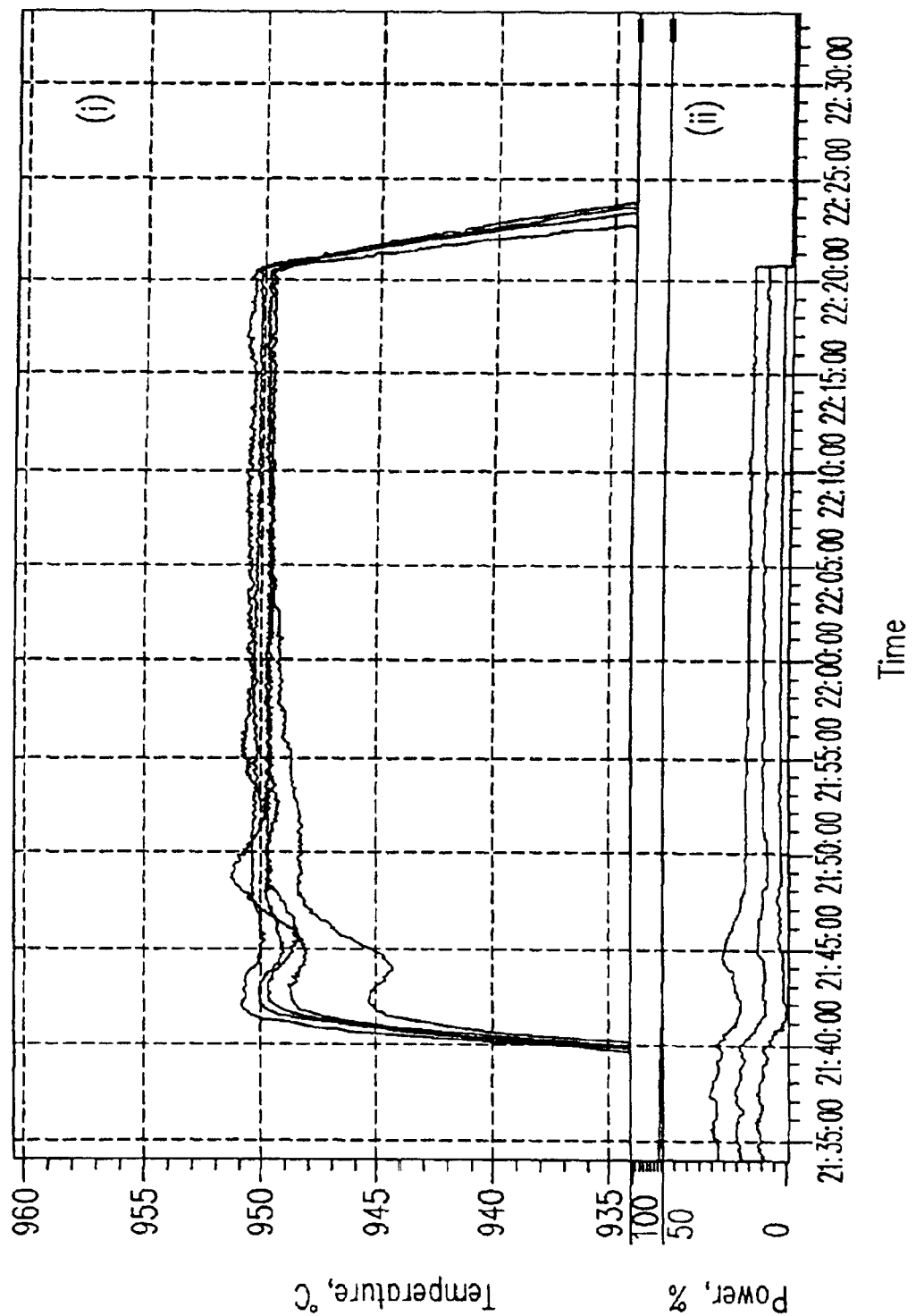
FIG. 7 is a graph: (i) showing a close up of the top of the wafer temperature profiles shown in FIG. 5, and (ii) displaying the weighted average for all zones according to one embodiment of the present invention.

Several tests was performed with the system and method of the present invention using a furnace similar to that shown in FIG. 1 and employing thermocouple instrumented wafers (semiconductor wafers with embedded thermocouples that provide temperature data for different regions of the wafer). FIGS. 4 to 7 show thermocouple instrumented wafer temperature data and furnace power delivery for an illustrative experiment in which the temperature ramp rate is accelerated and decelerated linearly and the maximum ramp rate is controlled to maintain the RDT below the maximum allowable thermal stress curve. A thermocouple instrumented wafer is heated from 600° C. to 950° C. under these conditions. FIG. 5 is a graph of data collected in this experiment showing: (i) the actual center and edge temperatures for all zones; (ii) the RDT value for all zones; and (iii) the furnace power for each zone over time. FIG. 6 (i) shows the weighted average of the center and edge temperature ($\frac{2}{3}$ edge+$\frac{1}{3}$ center) on the thermocouple instrumented wafer in this experiment, and FIG. 7 shows a close up of the top of the ramp in FIG. 5, and the weighted average for all zones.

In another experiment, the system and method of the present invention was carried out in a Rapid Vertical Processing (RVP) type furnace having five zones as shown in FIG. 1. FIG. 4 shows the ramped setpoint, plus the measured wafer temperature weighted average for all zones. This plot demonstrates how well the actual wafer temperatures conform to the temperature setpoint curves.

Figure 8:
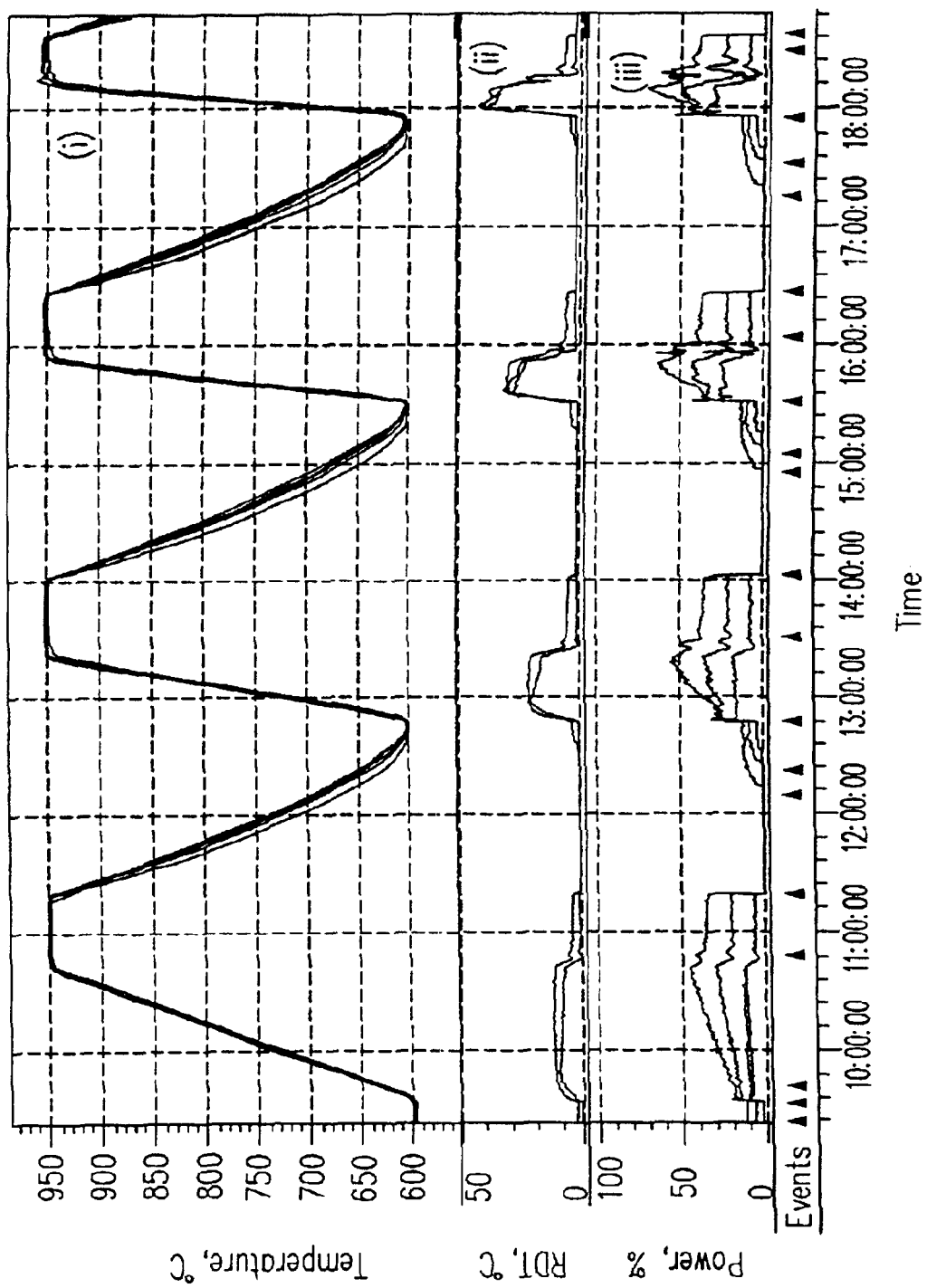
FIG. 8 is a graph showing: (i) the actual wafer center and edge temperatures for all zones for the 5, 10, 15 & 20 deg. C. $min^{-1}$ temperature ramp rates; (ii) the RDT value for each zone for each ramp rate; and (iii) the furnace power for each zone for each ramp rate over time for ramping without the RDT control method of the present invention.

FIG. 8 shows the results of a linear ramp test in which the ramp rate is not controlled by the present invention. The setpoint is ramped linearly, except that it is curved at the top of the ramp. FIG. 8 shows the actual wafer center and edge temperatures for all zones for the following ramp rates: 5, 10, 15 & 20 deg. C. min$^{-1}$. Section (ii) of FIG. 8 shows RDT for the wafer and section (iii) shows the applied power as a function of time. As FIG. 8 shows, increasing the ramp rate in the absence of RDT-based ramp rate control leads to dramatically greater RDT values than were observed in FIGS. 4 and 5 in which the method of the present invention was employed.

The system and method of the present invention provides desirable performance. The foregoing description of specific embodiments and examples of the invention have been presented for the purpose of illustration and description, and although the invention has been illustrated by certain of the preceding examples, it is not to be construed as being limited thereby. They are not intended to be exhaustive or to limit the invention to the precise forms disclosed, and obviously many modifications, embodiments, and variations are possible in light of the above teaching. It is intended that the scope of the invention encompass the generic area as herein disclosed, and by the claims appended hereto and

What is claimed is:

1. A method of changing the temperature of a body housed in a heating chamber of a temperature controlled furnace from a starting temperature to an ending temperature using a temperature control algorithm comprising the steps of:

providing temperature data from one or more temperature sensing devices in said heating chamber and a temperature set point as inputs to said temperature control algorithm which controls power delivery to one or more controllable heating elements in said furnace;

calculating a maximum allowable temperature ramp rate as a function of temperature comprising:

$$\Delta T = \frac{2}{.4928 \alpha E} C \frac{f \varepsilon^{\frac{1}{n}}}{ft} e^{\left(\frac{U}{nkT}\right)} \quad (1)$$

where $f\varepsilon/ft$ is the strain rate, E is Young's modulus, $\alpha$ is the coefficient of thermal expansion of the body, $C=4.5\times10^4$ N m$^{-2}$, n=2.9, k is Boltzmann's constant, and T is the absolute temperature of the edge of the body, and U is the activation energy for glide movement required for wafer slip;

accelerating said temperature set point from said starting temperature at a finite acceleration rate until said maximum allowable temperature ramp rate for the current temperature setpoint value is achieved; and decelerating said temperature set point at a finite deceleration rate until said ending temperature is reached such that the temperature of said body reaches said ending set point temperature smoothly without substantially overshooting or oscillating about said ending temperature.

2. The method according to claim 1 wherein said controllable heating elements are selected from the group consisting of radiant heat lamps and heating coils.

3. The method according to claim 1 wherein said temperature sensing devices are one or more thermocouples providing one or more temperatures for each of said one or more controllable heating elements.

4. The method according to claim 3 wherein a control temperature which is a mathematical combination of said one or more thermocouple temperatures is an input to said temperature control algorithm.

5. The method according to claim 4 wherein said control temperature is further defined to have a known offset from said thermocouple temperatures.

6. The method according to claim 5 wherein said temperature offsets are static offsets that correct said control temperature for differences between the temperature of said body and said thermocouple temperatures.

7. The method according to claim 1 wherein said body is a semiconductor substrate.

8. A temperature controlled furnace for changing the temperature of a body comprising:

a heating chamber housing one or more controllable heating elements, and one or more temperature sensing devices; and a temperature controller configured to carry out the method of claim 1.

* * * * *